United States Patent [19]

Newkirk et al.

[11] Patent Number: 5,729,462
[45] Date of Patent: Mar. 17, 1998

[54] METHOD AND APPARATUS FOR CONSTRUCTING A COMPLEX TOOL SURFACE FOR USE IN AN AGE FORMING PROCESS

[75] Inventors: Todd L. Newkirk, Hurst, Tex.; Mitchell C. Holman, Savannah, Ga.

[73] Assignees: Northrop Grumman Corporation, Los Angeles, Calif.; Gulfstream Aerospace Corporation, Savanah, Ga.

[21] Appl. No.: 519,460

[22] Filed: Aug. 25, 1995

[51] Int. Cl.⁶ .................................. G06F 19/00
[52] U.S. Cl. .................. 364/468.03; 364/474.07; 364/512; 364/578
[58] Field of Search .............. 364/468.03, 468.25, 364/472.01, 474.07, 476.01, 512, 578; 72/702, 389.1, 14.8

[56] References Cited

U.S. PATENT DOCUMENTS

| | | | |
|---|---|---|---|
| 2,455,702 | 9/1948 | Rechton et al. | 72/342.1 |
| 3,060,564 | 5/1962 | Corral | 72/342.1 |
| 3,354,691 | 11/1967 | Hall, Jr. | 72/371 |
| 3,550,422 | 12/1970 | Potter | 72/342.1 |
| 4,122,697 | 10/1978 | Hanyo et al. | 72/702 X |
| 4,125,929 | 11/1978 | Rode | 72/702 X |
| 4,408,471 | 10/1983 | Gossard et al. | 72/389 |
| 4,424,727 | 1/1984 | Mader | 72/702 X |
| 4,511,976 | 4/1985 | Graf | 72/702 X |
| 4,797,831 | 1/1989 | Dressing et al. | 72/702 X |
| 4,802,357 | 2/1989 | Jones | 72/702 X |
| 4,858,146 | 8/1989 | Shebini | 364/512 |
| 4,864,509 | 9/1989 | Somerville et al. | 364/167.01 |
| 4,947,666 | 8/1990 | Hametner et al. | 72/702 X |
| 4,962,654 | 10/1990 | Zbornik | 72/8 |
| 5,031,431 | 7/1991 | Naito | 364/474.07 |
| 5,148,693 | 9/1992 | Sartorio et al. | 72/702 X |
| 5,168,169 | 12/1992 | Brewer, Jr. et al. | 364/474.07 |
| 5,341,303 | 8/1994 | Foroudastan et al. | 364/474.07 X |
| 5,528,504 | 6/1996 | Brewer | 364/474.07 |

FOREIGN PATENT DOCUMENTS

| | | |
|---|---|---|
| 1627518 | 1/1970 | Germany . |
| 3416133 | 7/1985 | Germany . |
| 0104220 | 6/1984 | Japan . |
| 0096326 | 5/1985 | Japan . |
| 0036348 | 8/1985 | Japan . |
| 0183032 | 6/1966 | U.S.S.R. . |
| 0487692 | 10/1975 | U.S.S.R. . |

OTHER PUBLICATIONS

"Age Creep Forming Aluminum Aircraft Skins", Hambrick, Denise M., Avco Aerostructures Textron, Nashville, TN 37202, 1st International SAMPE Metals Conference, Aug. 18–20, 1987, pp. 135–143.

Primary Examiner—Joseph Ruggiero
Attorney, Agent, or Firm—Baker & Botts, L.L.P.

[57] ABSTRACT

A method is disclosed for constructing a complex tool surface for use in an age forming process. In one embodiment, the method comprises eight steps. Those steps are (1) modeling a flat panel as a set of finite elements, (2) modeling a rigid tool having a complex tool surface, (3) assigning material characteristics expressed as creep strain to each of the finite elements of the flat panel, (4) modeling the flat panel constrained to the rigid tool in an age forming process to produce a simulated age formed panel, (5) comparing the simulated age formed panel to an actual component and determining the differences, (6) modifying the rigid tool model to eliminate the differences determined in the comparison step, (7) repeating steps 4 and 5 with the modified rigid model until the differences fall within acceptable tolerances; and (8) constructing a tool for use in an age forming process in accordance with the modified rigid model.

20 Claims, 4 Drawing Sheets

METHOD AND APPARATUS FOR CONSTRUCTING A COMPLEX TOOL SURFACE FOR USE IN AN AGE FORMING PROCESS

"Copyright 1994 Vought Aircraft Company". A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatever.

TECHNICAL FIELD OF THE INVENTION

This invention relates generally to the field of age forming and more particularly to a method and apparatus for constructing a complex tool surface for use in the age forming process.

Age forming as a process for manufacturing metal parts and components is gaining wider use in the aerospace industry. Many of the parts used in the manufacture of aircraft have complex shapes comprised of surfaces with curvatures of varying radii and thicknesses. To construct such complex shaped components in the age forming process, a generally flat panel is constrained to a tool or die and baked in an autoclave under pressure for a specified period of time to relax induced stresses in the part. When the part is released from the constraints of the tool, it will spring back to a shape somewhere between the shape of the tool and the original shape of the flat panel. An important objective in designing tools for use in the age forming process is to construct the tool in such a way that once the age forming process is completed and the part is released, the part springs back to a shape that is identical to the intended final shape of the component. The difficulty in designing such a tool arises from the fact that the flat panel will have different spring back characteristics depending upon the type and thickness of the material, the radius of curvature at different points on the part, and influences due to the curvature of adjacent portions of the part itself.

Originally, tools for use in the age forming process were designed by trial and error. The tool designer would make a reasonable guess as to how the part would behave in the age forming process and construct the tool accordingly. The tool was then tested by comparing the formed part with the intended design. Discrepancies were noted and the tool was adjusted accordingly. The process would be repeated until the tool shape achieved the desired results of producing an age formed part meeting the design criteria. The disadvantages of this technique were the expense of reworking the tools and conducting the necessary experiments as well as the additional time required to design the correct tool.

In an effort to overcome these disadvantages, various efforts have been undertaken to design age forming tools using computers. One early effort is described in U.S. Pat. No. 5,168,169. The method disclosed in that patent describes testing, in an age forming process, individual samples selected from the material from which the part will be formed to determine the amount of spring back or retained strain resulting from the age forming process. Based on the data obtained from these samples, a stress relaxation curve is plotted and the amount of applied strain to be applied by the tool is then determined. The disadvantages of this approach are that it does not model either the tool or the part and requires experimenting and testing the actual tool to determine the final tool shape.

In another approach, described in U.S. Pat. No. 5,341,303, the age forming process is simulated in a computer on a series of two-dimensional planer cuts representing various features of the part to be age formed. The two-dimensional planar cuts are further approximated by circular elements of constant thickness. Based on these approximations a tool is designed. This method does not allow for modeling the entire part, thus experimentation on the actual tool is still required. Another disadvantage of this method is that it does not handle complex shapes since no relationship between applied and retained stress from one planer two-dimensional cut to the next is provided and this approach does not provide for the complete modeling of the entire part inducing error into the model due to the independence of one planer cut to the next.

Therefore, a need has arisen for a new method and apparatus for constructing a tool having a complex surface for use in an age forming process that overcomes the disadvantages and deficiencies of the prior art.

SUMMARY OF THE INVENTION

A method is disclosed for constructing a complex tool surface for use in an age forming process. In one embodiment, the method comprises eight steps. Those steps are (1) modeling a flat panel as a set of finite elements, (2) modeling a rigid tool having a complex tool surface, (3) assigning material characteristics expressed as creep strain to each of the finite elements of the flat panel, (4) modeling the flat panel constrained to the rigid tool in an age forming process to produce a simulated age formed panel, (5) comparing the simulated age formed panel to an actual component and determining the differences, (6) modifying the rigid tool model to eliminate the differences determined in the comparison step, (7) repeating steps 4 and 5 with the modified rigid model until the differences fall within acceptable tolerances; and (8) constructing a tool for use in an age forming process in accordance with the modified rigid model.

A technical advantage of the present invention is that a method for constructing a complex tool surface for use in an age forming process a tool can be designed without experimenting on the actual tool. Another technical advantage is that the invention provides a relationship between applied and retained stress for an entire part instead of two-dimensional planar cuts. Another technical advantage is that a complete modeling of the entire part is provided. Another technical advantage is that the complex tool surface can be modeled without actually constructing the tool.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

Figure 1A:
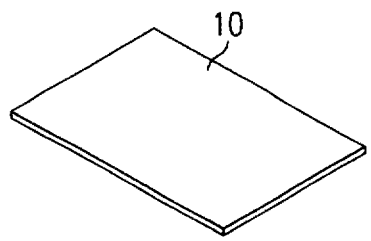
FIGS. 1A–1E illustrate the various steps of the age forming process employed in connection with the present invention.

The preferred embodiment of the present invention and its advantages are best understood by referring to FIGS. 1 through 8 of the drawings, like numerals being used for like and corresponding parts of the various drawings.

As background for understanding the present invention, the basic steps of forming a part using the age forming or age creep forming process is shown in FIGS. 1A through 1E. Age creep forming is a combination of the precipitation aging process with creep forming. The process provides a dimensionally stable component with low residual stresses. Age creep forming is accomplished by constraining either a plain panel 10 or a machined panel 14 to a developed tool 16, also shown in FIG. 7, having tool contour 18 for the duration of the aging cycle. Through creep, stress relaxation of the constrained panels 10 or 14 occurs and permanent deformation of the panel is achieved. The permanent deformation achieved is a function of tool contour 18 and the physical properties of panel 14. In determining the exact tool contour 18 of tool 16, the tool designer has to determine a relationship between the tool contour and the final part contour that accounts for spring back of the panel after it is released from the tool. The age forming process will now be described in more detail.

Figure 1B:
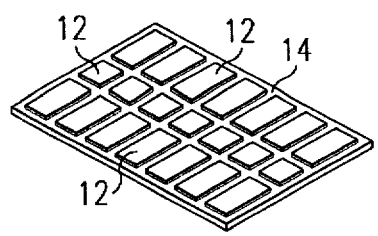
Figure 1C:
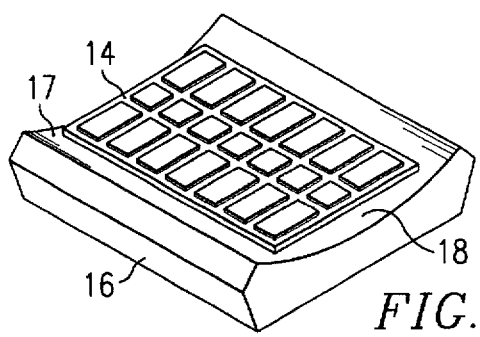
Figure 1D:
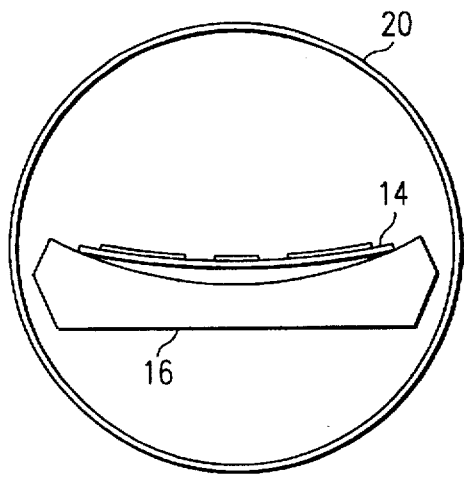
Figure 1E:
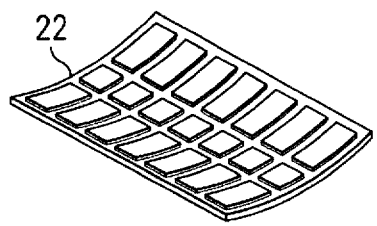

In FIG. 1A, flat panel 10 can be an aluminum panel, such as that used for a variety of components in the aircraft industry. In FIG. 1B, machined panel 14 is constructed after flat panel 10 has been machined at various machined elements 12. The machined elements 12 represent various cut-outs and thicknesses that will be incorporated into the final component. In FIG. 1C, machined panel 14 is shown positioned over tool 16 having tool contour 18 on tool surface 17. Machined panel 14 will be constrained to tool 16 at tool surface 17 and then baked in autoclave 20, shown in FIG. 1D, during the entire age forming process. When the age forming process is completed, machined part 14 is released from tool 16 and assumes the final shape of component 22 shown in FIG. 1E.

Figure 2:
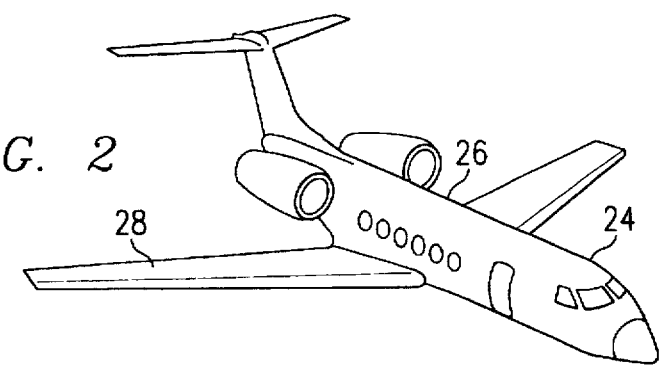
FIG. 2 illustrates various parts that can be formed in the age forming process that can use a complex tool surface constructed in accordance with the present invention.

To further illustrate the teachings of the present invention, it will be explained in connection with the construction of a wingskin for use on an aircraft. Referring to FIG. 2, aircraft 24 is shown having various components constructed of aluminum panels. A variety of those components such as fuselage 26 and wingskin 28 are constructed having a complex shape with a wide variation in thickness to optimize the parts for aerodynamics, load carrying capabilities and weight efficiencies.

Figure 7:
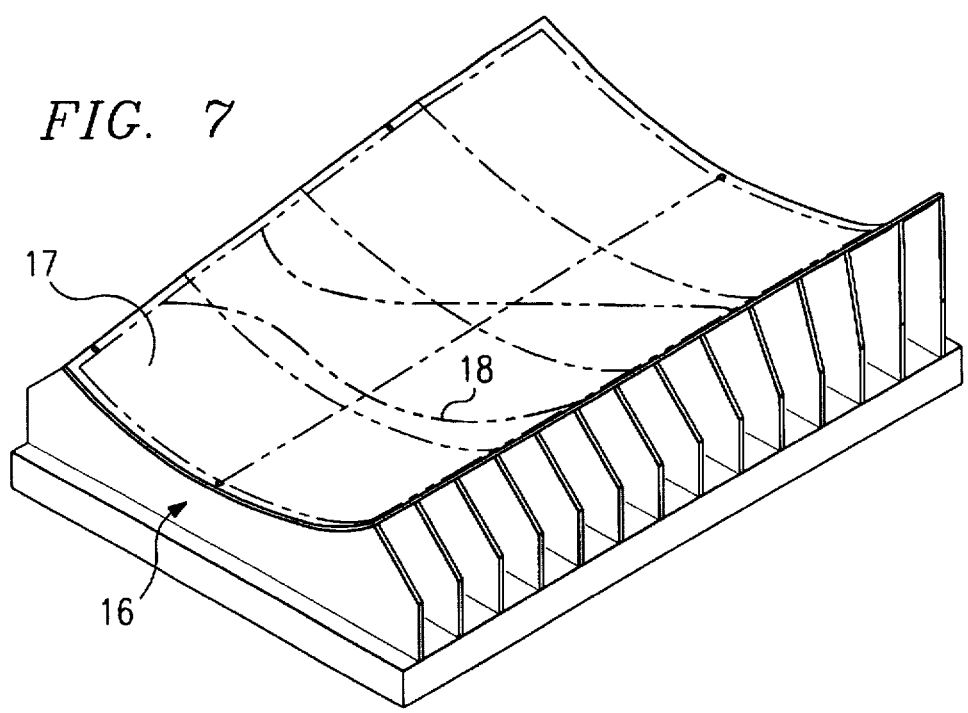
FIG. 7 shows a tool with a complex surface constructed in accordance with the teachings of the present invention.

Complex shaped components 26 and 28, when formed in the age forming process, are constrained to tools having complex shaped contours such as that shown in FIG. 7. Determining an accurate method for predicting the relationship between tool contour and the contour of the final component is achieved using the teachings of the present invention.

In the method of the invention, a finite element modeling (FEM) method provides a mechanism for analyzing the combined stresses and strains of the panel pressed to tooling surface contours in the age forming process. During the age forming process, sections of the panel will receive a variety of loads such as a compression, tension or bending load. Other sections of the panel will see combined loading such as a dominant compression load in conjunction with bending loads. The loading conditions, acting throughout the panel both in areas of constant thickness and in areas of integrally machined features, impart stresses and strains. FEM methods divide the panel into elements that can be analyzed with respect to the loading, geometry, boundary conditions and material characteristics of each specific element. Using the FEM method, not only can simple bending stresses be evaluated, but the FEM method can also evaluate dominant tension or compression situations and combined loading conditions as well as the simple bending situations.

Figure 3:
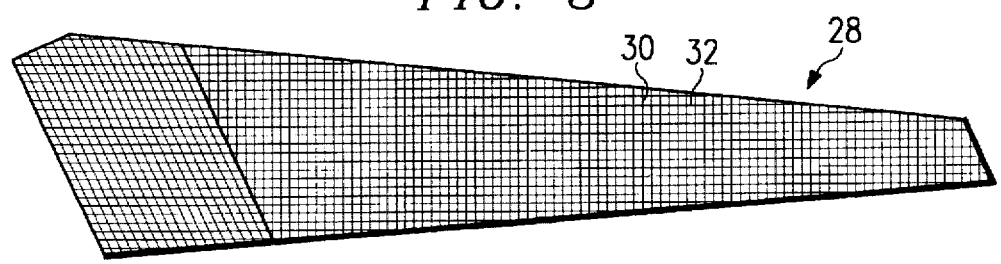
FIG. 3 shows a wingskin segmented into individual finite elements in accordance with the invention.

The FEM method of the present invention will now be described in connection with the remaining Figures. As shown in FIG. 3, wingskin 28 is shown as a geometrical representation divided into individual finite elements 30, connected together by nodes 32. In this way, the part can be analyzed with respect to the loading geometry, boundary conditions and material characteristics of each specific element.

The first step is to model a component such as wingskin 28 as a 3-D rendering using a conventional CAD system such as CATIA. After segmenting wingskin 28 into various finite elements 30, connected together by nodes 32, the actual wingskin 28 was reconfigured as a flat panel using software such as MSC/NASTRAN modeling software or the DEVELOP function in CATIA. The next step is to assign each element 30 a time hardening creep strain equation that characterizes the creep strain experienced by the part as a function of time. The equation is based upon the actual stress applied to the part at that element. In the preferred embodiment, the FEM method is performed using software such as ABAQUS version 5.2 by HKS. ABAQUS is one of the industry leading non-linear FEM codes available. Advantages of ABAQUS are that geometric non-linearity, such as buckling, is handled with an automatic cut-back incrementation scheme and material non-linearity can be as simple or complex as desired. Another geometric advantage of ABAQUS is the capability to model a general three-dimensional contact surface. Using ABAQUS, the tool contour is defined as a rigid body completely disconnected from the part. This capability provides an accurate method to model the actual age creep forming process.

Under ABAQUS, each element 30 to be analyzed will behave in accordance with the specified time hardening creep strain equation. The first step in defining the time hardening creep strain equation is to modify the equation provided in the software. In the preferred embodiment, a set of equations are supplied relating specifically to the alloy under consideration and taking into account the actual age creep forming process used.

Figure 4:
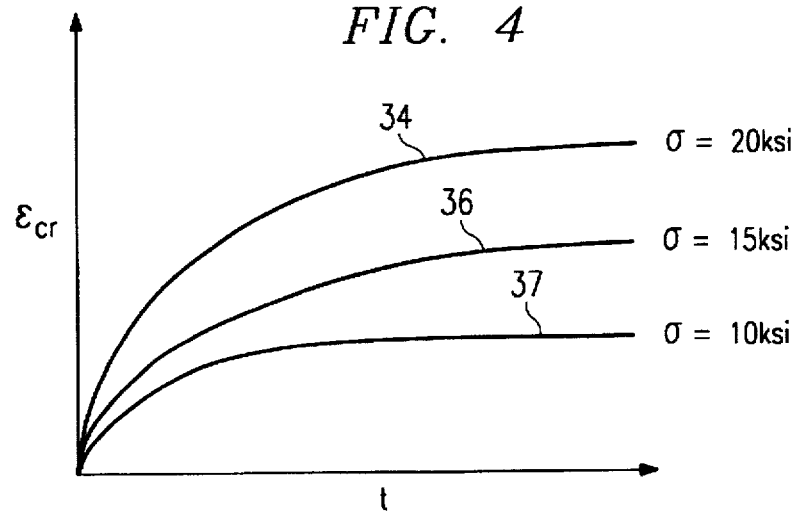
FIG. 4 is a creep strain vs. time curve for varying stresses.
Figure 5:
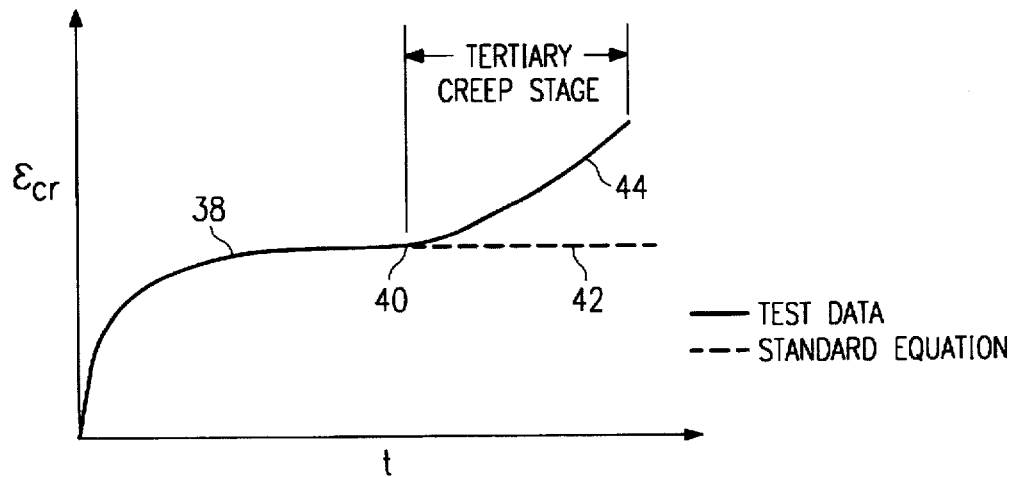
FIG. 5 is a creep strain vs. time curve illustrating tertiary creep.

The basic equation provided by the software was first modified in accordance with uniaxial tensile test results performed on the alloy under consideration. Creep strain was easily filtered from the total measured strain and plotted against time for a given stress as shown in FIG. 4. Curve 34 shows the creep strain for a stress of 20 ksi, curve 36 shows the creep strain for a stress of 15 ksi and curve 37 shows the creep strain for a stress of 10 ksi. Tests were performed and a creep law was defined for aluminum 7075-T651, 1¼" plate at 325 degree Fahrenheit. A matrix of coefficients was made for the purpose of finding a combination that would fit several mid-stress level creep strain verse time curves. Test data from uniaxial tension transverse grain creep test specimens were assembled into a spreadsheet with volumetric shrinkage included. The volumetric shrinkage was treated for as negative creep strain. The data from the spreadsheet was then curved fitted into a standard law equation. This one-equation-fits-all stress levels was undesirable for very high stresses where tertiary creep was experienced. This problem is demonstrated in FIG. 5. The power curve 38 would not allow for an inflection point 40 which diverged from the curve 42 predicted by the standard equation in the latter stages of the forming run. This divergence is shown by curve 44 which describes the tertiary creep stage. In order to account for this deficiency, the creep law was broken down into several, more accurate pieces. This occurred for several reasons. One of which was the fact that the standard equation creep strain was 0 for 0 stress, whereas, volumetric shrinkage should cause a negative strain. Another reason was that the 35 ksi creep strain versus time plot showed tertiary creep characteristics that could not be handled with the standard equation. Finally, one equation could not accurately define creep strain behavior for all stress levels between 0 and 35 ksi. As shown in FIG. 5, for the high stress regions shown by curve 44 beyond inflection point 40, a hyperbolic sine curve was utilized. Another equation had to be defined to describe the shrinkage behavior since the strain at 0 stress goes negative immediately. A third order polynomial fit the shrinkage data well. One other problem area was for 5 ksi stress. Since the test data contained shrinkage, the curve had to show a declining creep strain after approximately one hour. The shifted power curve was used here because of the good standard law behavior up to the point where the shrinkage took over.

A hyperbolic sine curve was used for stresses at or above 35 ksi, the standard power curve for stress between 10 and 30 ksi, a shifted power curve for a 5 ksi stress and a third order polynomial for a 0 stress level. A straight interpolation was used for every stress in between those defined equations. The following equations fit the creep test data for aluminum 7075-T651 providing a more accurate creep law definition:

Stress =35 ksi $$\epsilon_{total} = 8.597E{-}04 \sinh(2.3507E{-}09\sigma t)^{0.36975}$$

Stress=10–30 ksi $$\epsilon_{total} = 3.0438E{-}12\sigma^{1.3995} t^{0.4882}$$

Stress=5 ksi $$\epsilon_{total} = 1.785E{-}05 t^{0.24807} - 0.01354(1.591E{-}09t)^{0.40}$$

Stress=0 ksi $$\epsilon_{shrinkage} = -1.2361E{-}18t^3 + 2.2517E{-}13t^2 - 1.5203E{-}08t$$

A FORTRAN sub-routine was written to define shrinkage strain and creep strain using the four creep law equations to cover all stress levels experienced in the age forming process. A copy of the FORTRAN subroutine is attached as Appendix A.

Figure 6:
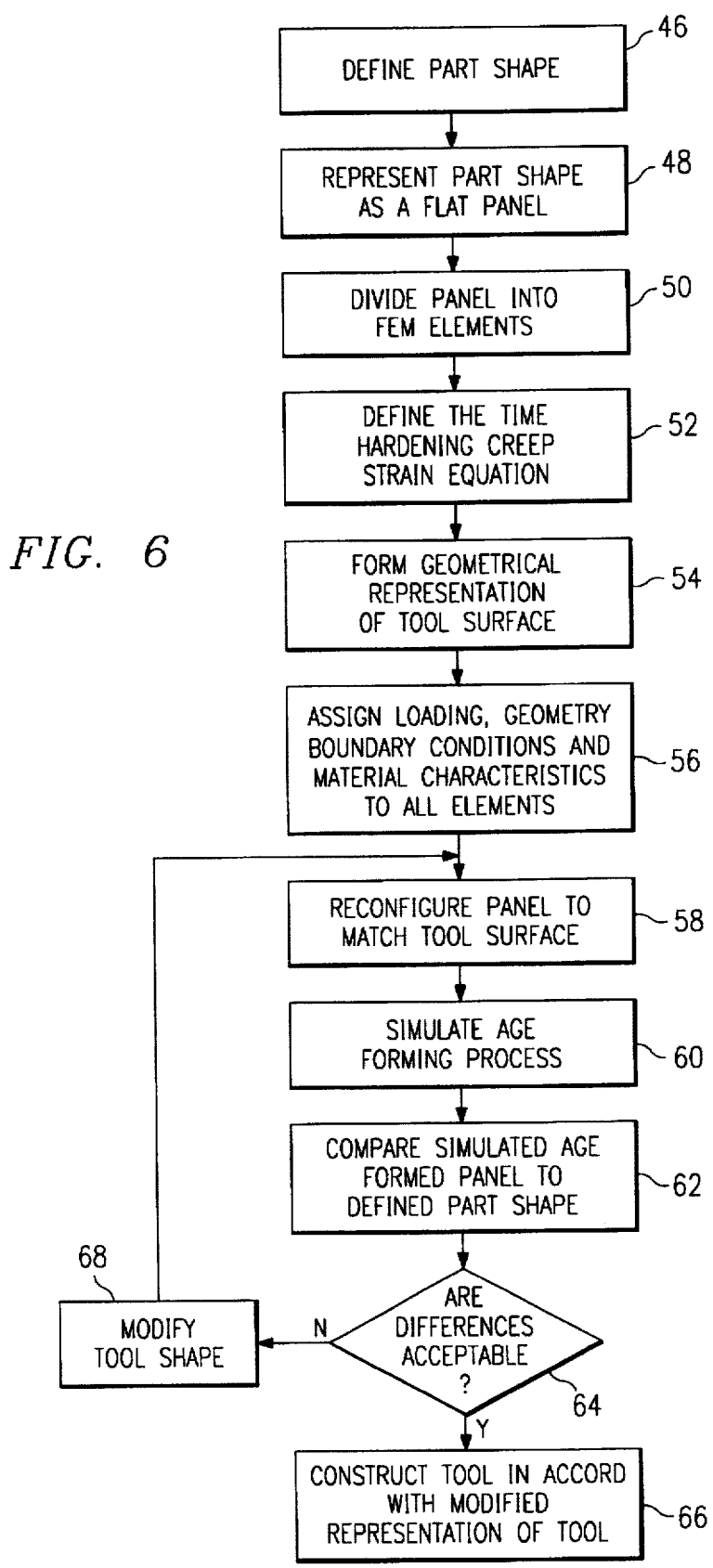
FIG. 6 is a flow chart illustrating the method of the invention.
Figure 8:
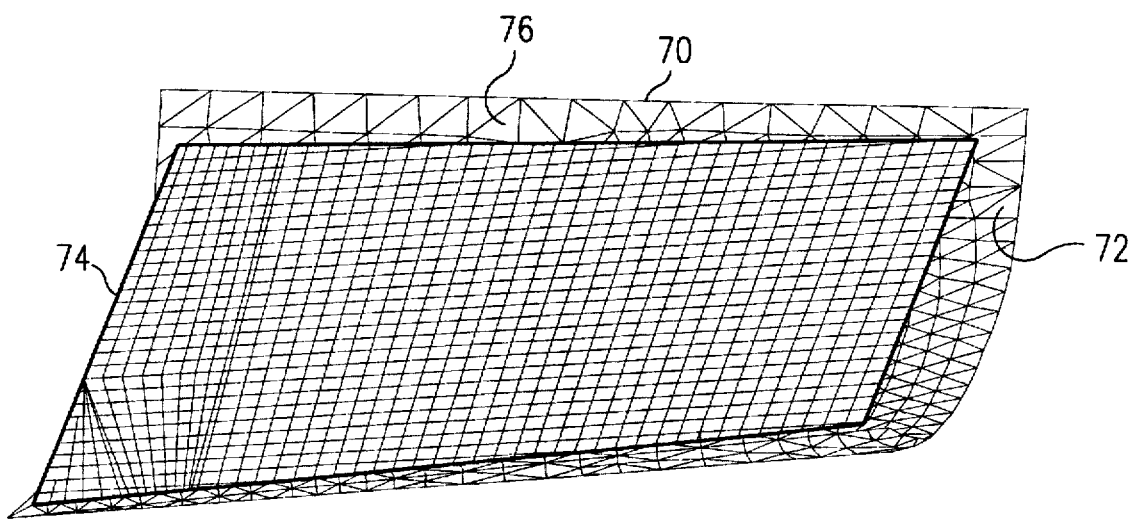
FIG. 8 illustrates a model of a part constrained to a model of a rigid tool in accordance with the present invention.

Referring now to FIG. 6, a flowchart illustrating the method of the present invention will be described. Initially, the component is defined and described by a specific complex shape in step 46. In the preferred embodiment, the part was defined using the CATIA CAD system as a 3-D rendering or geometric representation including all contours, cut-outs and thicknesses of the part as will appear in the final component. Once the part has been defined, the next step 48 requires translating the 3-D rendering of the part into a flat or 2-D panel. Conventional CAD systems generally provide for converting a three-dimensional part to a flat panel. In CATIA, the DEVELOP function is typically used. Once the part has been defined as a flat panel, in the next step 50 the part is segmented into individual elements that will form the basis of the finite element modeling method. At step 52 the time hardening creep strain equation is defined. Once the elements have been assigned and the time hardening creep strain equation defined, the next step 54 requires defining a tool surface. The tool surface can be defined and represented geometrically at step 54 in exactly the same way as the part itself using a conventional CAD system. In the preferred embodiment, the tool surface was defined by adopting the final part shape with suitable extensions to compensate for the edges of the actual part. Once the panel has been divided into finite elements and the tool surface has been represented geometrically, the next step 56 is to assign loading, boundary conditions and the material characteristics to each element. In the next step 58, the panel is then reconfigured to match the tool surface, as shown in FIG. 8, and then the age forming process is simulated at step 60. After the age forming simulation is completed, the simulated age formed panel is compared to the defined part shape and differences are noted in step 62 and a decision point 64 is reached. If the differences are acceptable, the simulation is complete and the next step 68 is to construct a tool using a conventional CAM system in accordance with the geometrical representation of the tool surface. A completed tool is shown in FIG. 7. If the differences are unacceptable, the geometrical representation of the tool is modified in step 68 and the simulation is repeated until acceptable differences are obtained.

A detailed definition of the finite element analysis for the age creep forming process model follows. The first step in defining the model is to test the material properties of the particular alloy in question. In the preferred embodiment aluminum alloys were used, however, any metal alloys suitable for age creep forming can be used in connection with the teachings of this invention. A test matrix consisting of transverse grain uniaxial tension creep specimens and transverse grain uniaxial tension stress relaxation specimens provide the data necessary to develop acceptable age creep forming material characteristics to represent the component such as the upper wingskin. To the extent the preliminary creep law used by the FEM software, such as ABAQUS, has to be modified, it can be changed by use of a subroutine.

The initial full component is developed in a CAD system. Once an initial tool surface is defined using the 3-D CAD rendering of the component, it is necessary to transfer the edge of part (EOP), and add backing access, to begin designing the tool itself. To get the part EOP on the tool surface, which was more highly contoured than the part surface due to the large amount of spring back, a method of mapping geometry between the two surfaces was devised.

The part geometry was flattened to a plane using flat patterning software shown in FIG. 3. The tool surface was also flattened to a plane along with the reference geometry on it. The flattened part was moved to line up with the reference geometry on the tool flat pattern. The part geometry was projected to the tool flat pattern surface to establish a logical link. The flat part geometry could then be reverse mapped to the tool surface. The DEVELOP function was used for the large tool and this required approximating the surface sections to ruled surfaces one section at a time shown in FIG. 8. Referring to FIG. 8, the geometric representation 70 of the tool shown in FIG. 7 is represented at 72.

The geometrical representation 74 of the part is then aligned with geometrical representation 70 of the tool.

Developing the ABAQUS model of the component age forming process consisted primarily of five steps: (1) model the flat panel, (2) model the rigid tool, (3) model the material characteristics of the part, (4) model the loading scenario and (5) model the boundary conditions. With respect to modeling the flat panel this was accomplished using MSC/NASTRAN. A model was built of the component in its final shape. Mesh density was driven by the land width where one row of elements modeled each land. As a result 4,219 elements, mostly CQUAD4 quadrilateral shells, were used. The shell element provides a means by which to model thin structure. Non-linear NASTRAN analysis was used to push the final component model flat. The component was flattened out by applying enforced displacements to each node, requiring a final z coordinate to be zero but allowing unconstrained inplane movement. After defining the flat coordinates for all 4,334 nodes, the NASTRAN model was translated to PDA/PATRAN mode. The PATRAN model was then translated into HKS/ABAQUS format. All of the remaining FEM runs were made using ABAQUS. The equivalent ABAQUS element for CQUAD4 is the S4R5, also a quadrilateral shell element. This flat skin model was used throughout the tool contour study with the thickness and trim updated to reflect final skin design.

In the next step the rigid tool is modeled. The approach that was adopted was to define the tool surface contour as a rigid 3-D surface since ABAQUS allows for the definition of a general 3-D contact surface. The part and the tool were uncoupled and pressure loads were used to push the part against the tool. This approach follows the actual forming process very closely. The original tool surface was the component shape and was available in the CAD software. The EOP of the flat panel was merged into this CAD file and excess tool surface 76 (FIG. 8) was created. Excess surface 76 was desired since it was unknown how much growth to expect and what path the panel would take. The model panel had to start in the flat configuration and slide along the tool surface whereas in the real world, the panel would have gravity to assist in conforming to the tool.

Once the tool surfaces were extended, the flat panel EOP was aligned with the tool to balance the gap at the two ends of the model. After the alignment had been made in the CAD software the tool surface was translated into PATRAN and meshed with 2,500 Bezier patches. The PATRAN model was output in ABAQUS format and merged with the panel model to make a pro ABAQUS input deck. The next step was to model the material characteristics. A creep law was defined from the transfer grain uniaxial tension creep test data to fit the general form available in ABAQUS. As more time and data became available a user defined FORTRAN sub-routine was developed to describe the creep and shrinkage behavior. The FORTRAN sub-routine allowed for the definition of as many creep equations as desired. Four different equations were used to cover all stress levels. A hyperbolic sine curve was used for stresses at or above 35 KSI, a standard power curve was used for stresses between 10 and 30 KSI, a shifted power curve for a 5 KSI stress and a third order polynomial for a zero stress level. A straight interpolation was used for every stress in between those equations. Since the material was assumed to stay elastic while pushing the part to the tool, plastic properties other than creep were not necessary. The modulus of elasticity and the co-efficient of thermal expansion were defined in the ABAQUS model dependent upon temperature.

In the next step the ABAQUS model loading scenario was designed to closely follow the actual autoclave forming cycle. The main difference between the two was that the temperature and the pressure were applied instantaneously in the ABAQUS model not allowing any creep strain to accumulate during those steps. The reason for this difference was that creep data would have to have been defined for all temperatures from room temperature to 325° F. which was not feasible.

The ABAQUS model of the component consisted of four steps. First a pressure of 20 psi was applied to the IML of the component while heating the skin to 325° F. Next the pressure was increased to 180 psi. The third step was to hold the current load steady for twenty-four hours. Finally the pressure load was released and the skin was cooled to room temperature. The reason for spreading the 180 psi pressure load into two steps was to start with a large initial load increment thereby reducing the run time. It should be noted that springs were used at each skin node in the Z direction while pushing the skin to the tool. The springs, however were removed prior to releasing the pressure in step four.

In the next step the boundary conditions are modeled. In the final production component model the nodes along a line were "slotted" along the long axis. One node, however, was held constant in plane to create a fixity. In addition to the above mentioned fixity, one node at the end had an enforced displacement applied to resist rotation. The enforced displacement was removed in step 2 after the panel was in contact over a majority of the surface, to avoid causing erroneous results. One problem was encountered while solving the first step of the ABAQUS model. Rotating the skin down closer to the tool at the end prevents the skin from buckling along the leading edge near the end, which will cause the run to diverge.

A major concern in developing the model for a tool surface is the question concerning what tool contour to start with and how to hone in on the correct tool surface. The actual final shape of the component was selected as the starting surface for two reasons. The first was that it had the correct basic shape that the tool would need to have and the second was that a set of coordinates for each node on the skin of the final component would be needed during the iteration procedure. In order to be certain of always stepping in the right direction the following procedure was used. A new tool surface would be based on the displacement delta in the nodal x, y and z directions between the final shape and the spring back skin shape from the previous tool. In other words, for each node on the skin a delta x, y and z between the sprung back skin and the final component shape would be added to the nodal coordinates at the previous TOOL. Several sets of nodal skin coordinates and nodal skin displacement deltas were required. ABAQUS model data required to create points for a new tool were as follows: (1) flat pattern coordinates, (2) final component deltas from flat, (3) last tool deltas from flat and (4) sprung back deltas from flat. The previously defined iteration procedure resulted in a set of 4,334 coordinates. This set was entered into a CAD file using an interface program. In the preferred embodiment the CATIA program was used and the interface program NODALF was employed. Once the points were in the CAD file one of two methods to surface the points was used. Initially, selected strips of points were splined together and then surfaced. An alternative method employed defining several smooth chordwise curves and surfacing these curves.

While the invention has been particularly shown and described by the foregoing detailed description, it will be understood by those skilled in the art that various other changes in form and detail may be made without departing from the spirit and scope of the invention.

What is claimed is:

1. A method for constructing a complex tool surface for use in the age forming process comprising:
   a. Modeling a flat panel as a set of finite elements;
   b. Modeling a rigid tool having a complex tool surface;
   c. Assigning material characteristics to each of the finite elements of the flat panel;
   d. Modeling the flat panel constrained to the rigid tool in an age forming process to produce a simulated age formed panel; and
   e. Comparing the simulated age formed panel to an actual component and determining the differences;
   f. Modifying the rigid tool model to eliminate the differences determined in the comparison step;
   g. Repeating steps d and e with the modified rigid model until the differences fall within acceptable tolerances; and
   h. Constructing a tool for use in an age forming process in accordance with the modified rigid model.

2. The method of claim 1 further comprising the initial step of modeling an actual component as a 3-D rendering.

3. The method of claim 2 wherein the 3-D rendering is performed in a CAD system.

4. The method of claim 1 wherein the material characteristics are represented by a creep strain equation.

5. The method of claim 1 wherein the material characteristics are represented by a plurality of creep strain equations.

6. The method of claim 5 further comprising the step of selecting a creep strain equation on the basis of applied stress.

7. The method of claim 1 wherein the tool is constructed using a computer aided manufacturing system.

8. A method for constructing a complex tool surface for use in the age forming process comprising:
   a. Forming a geometrical representation of a panel;
   b. Forming a geometrical representation of a tool surface representing an age forming tool shape;
   c. Segmenting the geometrical representation of the entire work piece into individual panel elements;
   d. Segmenting the geometrical representation of the tool surface into individual tool elements;
   e. assigning a time hardening creep strain equation to each panel element;
   f. Reconfiguring the geometrical representation of the entire panel to match the geometrical representation of the tool surface;
   g. Assigning an induced stress to each individual element of the panel;
   h. Simulating the reconfigured panel's exposure to an elevated temperature environment to relax the induced stress on each individual element of the panel in accordance with the time hardening creep strain equation assigned to each panel element;
   i. Simulating releasing the constraints on the panel reconfigured to the shape of the age forming tool to produce a simulated panel shape;
   j. Comparing the simulated panel to a geometrical representation of a part to determine differences between the part and the panel;
   k. Modifying the geometrical representation of the tool to account for the differences between the part and the panel;
   l. Repeating steps a–k until the differences between the panel and the part fall within acceptable tolerances; and
   m. Constructing a tool in accordance with the modified geometrical representation of the tool.

9. The method of claim 8 further comprising the initial steps of modeling an actual component that is used to form the geometrical representation of the panel.

10. The method of claim 9 wherein the actual component is a 3-D rendering.

11. The method of claim 8 wherein the tool surface has a complex shape.

12. The method of claim 8 wherein the geometrical representation of the tool is the same as a 3-D rendering of an actual component.

13. The method of claim 8 wherein there are a plurality of time hardening creep strain equations.

14. The method of claim 13 wherein the time hardening creep strain equations are assigned on the basis of an applied stress.

15. Apparatus for constructing a complex tool surface for use in an age forming process, the apparatus comprising:
   a. A computer model of a flat panel representing a component where the part has been broken down into finite elements connected by a plurality of nodes;
   b. A computer model of a tool having a complex shape;
   c. A routine for assigning characteristics to all of the finite elements;
   d. Means for simulating the flat panel model constrained to the tool model in an age forming process to produce a simulated component;
   e. Means for adjusting the tool model in response to the differences between the component and the simulated component; and
   f. Means for constructing the tool in accordance with the adjusted tool model.

16. The apparatus of claim 15 wherein the computer model is a CAD system.

17. The apparatus of claim 15 wherein the characteristics are represented by a creep strain equation.

18. The apparatus of claim 15 wherein the characteristics are represented by a plurality of creep strain equations.

19. The apparatus of claim 18 wherein the creep strain equations are assigned on the basis of applied stress.

20. The apparatus of claim 15 wherein the adjusted tool model is provided to a CAM system.

* * * * *

UNITED STATES PATENT AND TRADEMARK OFFICE
CERTIFICATE OF CORRECTION

PATENT NO.   : 5,729,462
DATED        : March 17, 1998
INVENTOR(S)  : Newkirk, et al.

It is certified that error appears in the above-identified patent and that said Letters Patent is hereby corrected as shown below:

Title page, item [75], add inventor --Robert V. Hodges, Savannah, Ga.--.

Signed and Sealed this

Thirty-first Day of August, 1999

Attest:

Q. TODD DICKINSON

*Attesting Officer*        *Acting Commissioner of Patents and Trademarks*